United States Patent
Koo

(10) Patent No.: US 9,130,514 B2
(45) Date of Patent: Sep. 8, 2015

(54) $V_{com}$ SWITCHING AMPLIFIER

(75) Inventor: Ronald Bonshaw Koo, Los Altos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 188 days.

(21) Appl. No.: 13/401,591

(22) Filed: Feb. 21, 2012

(65) Prior Publication Data

US 2012/0218249 A1    Aug. 30, 2012

Related U.S. Application Data

(60) Provisional application No. 61/446,662, filed on Feb. 25, 2011.

(51) Int. Cl.
*G06F 3/038* (2013.01)
*G09G 5/00* (2006.01)
*H03F 3/217* (2006.01)

(52) U.S. Cl.
CPC ............ *H03F 3/2173* (2013.01); *H03F 3/2175* (2013.01); *G09G 2330/021* (2013.01)

(58) Field of Classification Search
None
See application file for complete search history.

(56) References Cited

U.S. PATENT DOCUMENTS

| | | | |
|---|---|---|---|
| 5,481,273 A * | 1/1996 | Shigeta et al. | 345/94 |
| 6,552,606 B1 * | 4/2003 | Veltman et al. | 330/10 |
| 2002/0044223 A1 | 4/2002 | Miller | |
| 2004/0104831 A1 | 6/2004 | May | |
| 2005/0140400 A1 | 6/2005 | Yi et al. | |
| 2006/0245517 A1 | 11/2006 | Ikedo et al. | |
| 2008/0157825 A1 | 7/2008 | Hsu | |
| 2012/0133634 A1 | 5/2012 | Her et al. | |

OTHER PUBLICATIONS

Office Action dated Feb. 13, 2014, in related U.S. Appl. No. 13/405,090, filed Feb. 24, 2012.
Non-Final Rejection dated Jun. 16, 2014, in related U.S. Appl. No. 13/405,049, filed Feb. 24, 2012.
Final Rejection dated Jun. 18, 2014, in related U.S. Appl. No. 13/405,090, filed Feb. 24, 2012.
Non-Final Office Action mailed Nov. 26, 2014 in related U.S. Appl. No. 13/405,090, filed Feb. 24, 2012 (19 pgs).
Non-Final Office Action mailed Dec. 23, 2014, in related U.S. Appl. No. 13/405,049, filed Feb. 24, 2012 (10 pgs).
Final Office Action dated Jun. 18, 2015, in related U.S. Appl. No. 13/405,049, filed Feb. 24, 2012 (12pgs).
Final Office Action dated Mar. 25, 2015, in related U.S. Appl. No. 13/405,090, filed Feb. 24, 2012 (23pgs).

* cited by examiner

*Primary Examiner* — Nicholas Lee
(74) *Attorney, Agent, or Firm* — North Weber & Baugh LLP

(57) ABSTRACT

Certain electronic devices with displays, such as LCDs, are configured to provide a common voltage to a display backplane. The common voltage is supplied by a common voltage application circuit coupled to the display. The common voltage application circuit includes a switching amplifier configured to output the common voltage. The switching amplifier functions as a switching power supply having improved power efficiency compared to conventional common voltage application circuits.

18 Claims, 4 Drawing Sheets

$V_{com}$ SWITCHING AMPLIFIER

RELATED APPLICATIONS

This application claims priority of U.S. Provisional Application No. 61/446,662, filed Feb. 25, 2011, entitled "$V_{COM}$ Switching Amplifier," listing Ronald Bonshaw Koo as inventor, which application is hereby incorporated herein by reference in its entirety.

FIELD OF THE INVENTION

This invention relates to displays for electronic devices. More specifically, this invention relates to amplifiers used to provide a common voltage to a display panel.

BACKGROUND OF THE INVENTION

Displays are used on notebook PCs, televisions, and other electronic devices. Like most electronic devices, displays must be calibrated to accurately display video and graphic images. For example, the common voltage of a display is calibrated for optimum viewing and operation. Without proper calibration, the image on the display can substantially flicker. In some types of displays, such as liquid crystal displays (LCDs), e-ink displays, and electro-wetting displays, the pixel material can be damaged if the common voltage is not set correctly.

Some displays are characterized by a common voltage ($V_{COM}$), herein referred to as $V_{COM}$ displays. The $V_{COM}$ voltage is applied to the backplane of a $V_{COM}$ display panel. Application of the $V_{COM}$ voltage allows for adjustment of the absolute voltage applied to the pixel, when the pixel is turned on. When the $V_{COM}$ voltage is properly adjusted, approximately the same absolute voltage is applied to the pixel during the entire cycle of the analog source voltage that is supplied to the pixel. Providing a substantially constant absolute on-voltage to the pixel substantially eliminates perceived flicker. Proper calibration of the $V_{COM}$ voltage also maintains a substantially zero volt average across the pixel which prevents the pixel material from becoming damaged, such as causing an image to be burned into the display screen.

The $V_{COM}$ voltage is supplied using an appropriate $V_{COM}$ application circuit. During the assembly of each conventional $V_{COM}$ display panel, the $V_{COM}$ voltage level can be calibrated by electronically adjusting parameters associated with the $V_{COM}$ application circuit. In some processes, a technician views a test image on the LCD and manually adjusts the $V_{COM}$ application circuit through empirical trial and error until the image does not have flicker. In other processes, the $V_{COM}$ voltage calibration can be performed by monitoring the illumination of the $V_{COM}$ display panel and inputting the detected illumination levels into a software algorithm to determine the proper $V_{COM}$ voltage level. The determined proper $V_{COM}$ voltage level is then set by the $V_{COM}$ application circuit. The proper $V_{COM}$ voltage level is then stored in non-volatile storage or set by a resistor string on the display controller board for the life of the $V_{COM}$ display.

Conventional $V_{COM}$ application circuits use a Class AB amplifier to generate the proper $V_{COM}$ voltage level that is provided to the $V_{COM}$ display panel. FIG. 1 illustrates an exemplary conventional $V_{COM}$ application circuit 10. A digital-to-analog converter (DAC) 2 receives as input a digital code representative of the proper $V_{COM}$ voltage level. The DAC 2 outputs a converted analog signal to a first input of an amplifier 4. The amplifier 4 is a Class AB operational amplifier. A second input of the amplifier 4 is a feedback signal. The amplifier 4 is supplied with an analog power supply voltage AVDD. An output of the amplifier 4 is the $V_{COM}$ voltage level that is supplied to a backplane, or $V_{COM}$ plane, of a LCD panel 20. The $V_{COM}$ plane can be conceptually modeled as a distributed RC. In some applications, the $V_{COM}$ voltage level is substantially constant. An alternative configuration of the $V_{COM}$ application circuit 10', as shown in FIG. 1B, can also be implemented to provide a constant $V_{COM}$ voltage level. The $V_{COM}$ application circuit 10' includes a local feedback from the output of the Class AB amplifier 4' to the second input of the Class AB amplifier 4'. The Class AB amplifier 4' can be the same or different than the Class AB amplifier 4 in FIG. 1A. In other applications, the $V_{COM}$ voltage level can be adjusted using the $V_{COM}$ application circuit 10 (FIG. 1A) by providing a feedback signal from the $V_{COM}$ plane 20 to the second input of the Class AB amplifier 4.

The $V_{COM}$ plane distributes the $V_{COM}$ voltage to each pixel within the LCD panel. In conventional applications, LCD panels include rows of pixels, each pixel in a row connected to a common gate line. As each row of pixels is refreshed, hundreds, if not thousands, of pixels may be simultaneously drawing current. Inclusion of the amplifier within $V_{COM}$ application circuit accommodates the simultaneous drawing of current by a large number of pixels.

The output stage of a typical Class AB amplifier includes two complimentary transistors configured for sourcing and sinking current. The transistors in a Class AB amplifier operate in the linear mode. The power efficiency of the output stage is at best 50%.

SUMMARY OF THE INVENTION

Electronic devices with a $V_{COM}$ display panel are configured to provide a common voltage to a $V_{COM}$ display panel backplane. The common voltage is supplied by a common voltage application circuit coupled to the $V_{COM}$ display panel. The common voltage application circuit includes a switching amplifier having a switching output stage configured to output the common voltage. An optional filter is coupled between an output of the switching amplifier and an input of the $V_{COM}$ display panel. The switching amplifier functions as a switching power supply having improved power efficiency compared to conventional common voltage application circuits.

In an aspect, an electronic device for driving a display that uses a common voltage is disclosed. The electronic device includes a common voltage application circuit coupled to the display to supply the display with the common voltage, wherein the common voltage application circuit includes a switching amplifier configured to output a switching waveform used to form the common voltage. The display can be a liquid crystal display. The liquid crystal display can have a plurality of pixels, and the common voltage is supplied to each pixel of the plurality of pixels. The switching amplifier can be coupled to an analog power supply. The analog supply voltage can supply a voltage in the range of about 8V to about 30V. The switching amplifier can be a Class D amplifier. The common voltage application circuit can also include a filter coupled between the switching amplifier and the display. The common voltage application circuit can also include an inductor, wherein the filter includes the inductor and a capacitance of the display. The common voltage application circuit can also include a capacitor, wherein the filter further includes the capacitor. The electronic device can also include a control circuit coupled to the switching amplifier, wherein the control circuit is configured to control the switching amplifier so as to modulate a duty cycle of the switching waveform.

In another aspect, another electronic device for driving a display that uses a common voltage is disclosed. The electronic device includes a common voltage application circuit coupled to the display to supply the display with the common voltage. The common voltage application circuit includes a Class D switching amplifier and an inductor. The Class D switching amplifier is configured to output a switching waveform. The inductor is coupled to an output of the Class D switching amplifier and configured to receive the switching waveform and output the common voltage.

In yet another aspect, a method of driving a display that uses a common voltage is disclosed. The method includes using a switching amplifier to supply a switching waveform, forming a common voltage from the switching waveform, and providing the common voltage to the display.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a $V_{COM}$ application circuit. Those of ordinary skill in the art will realize that the following detailed description of the $V_{COM}$ application circuit is illustrative only and is not intended to be in any way limiting. Other embodiments of the $V_{COM}$ application circuit will readily suggest themselves to such skilled persons having the benefit of this disclosure.

Reference will now be made in detail to implementations of the $V_{COM}$ application circuit as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the present application are directed to an electronic device with a $V_{COM}$ display panel coupled to a $V_{COM}$ application circuit having a switching amplifier to supply a $V_{COM}$ voltage to the $V_{COM}$ display panel. In some embodiments, the switching amplifier is a Class D amplifier. An output stage of the switching amplifier includes a pair of complimentary transistors that are switched on and off such that the switching amplifier functions effectively as a switching power supply. A power efficiency of the switching amplifier is at least 80%, which is a significant improvement over the conventional $V_{COM}$ application circuit using a Class AB amplifier. If necessary, an inductor and a capacitance of a $V_{COM}$ backplane of the $V_{COM}$ display panel filters the output signal of the switching amplifier.

Figure 1A:
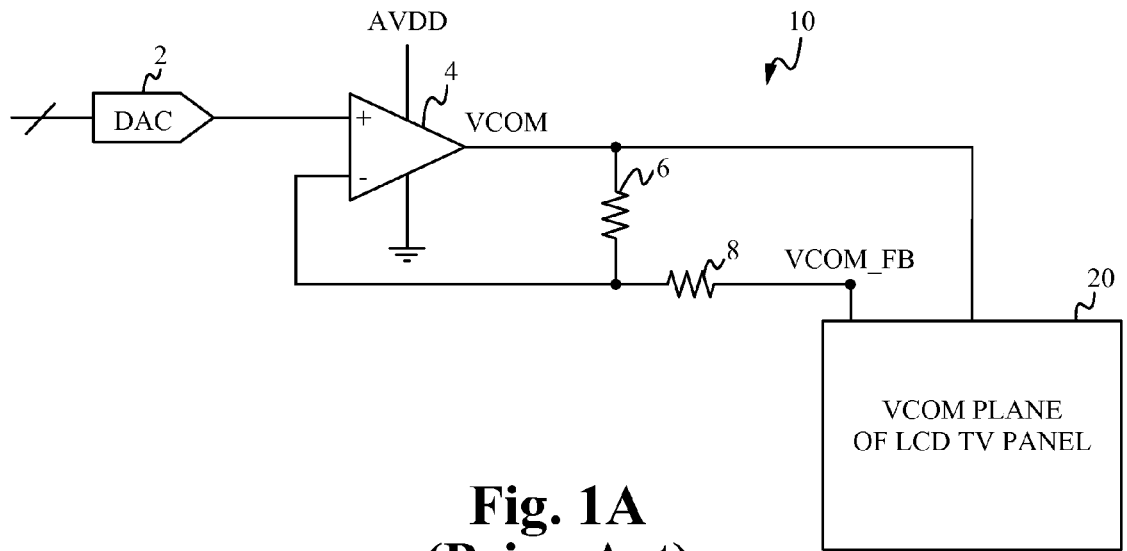
FIG. 1A illustrates a conceptual diagram of an exemplary conventional $V_{COM}$ application circuit.
Figure 1B:
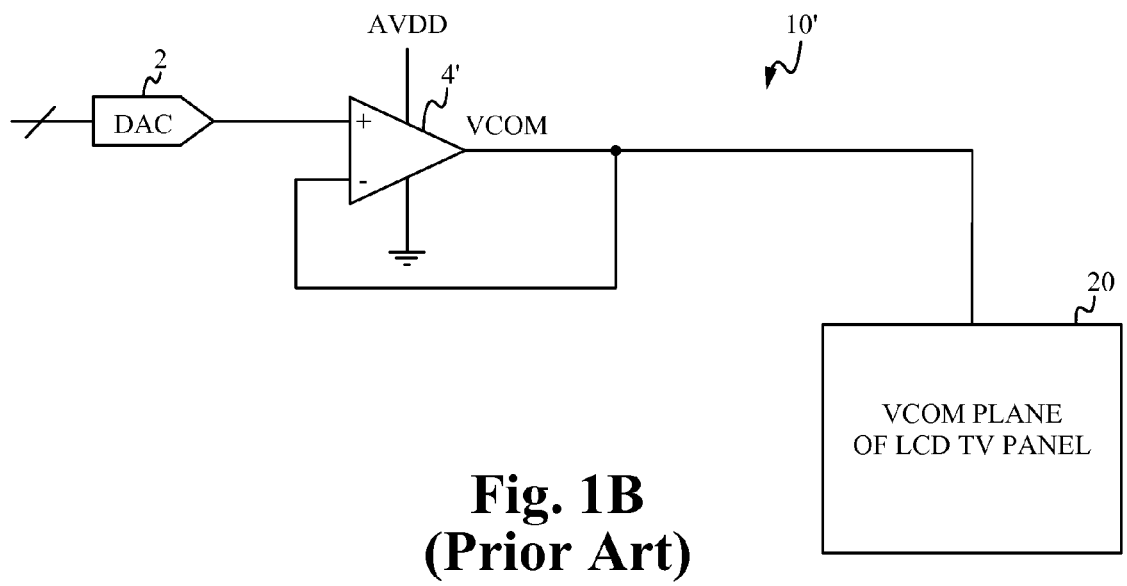
FIG. 1B illustrates a conceptual diagram of an exemplary conventional $V_{COM}$ application circuit according to an alternative configuration.
Figure 2A:
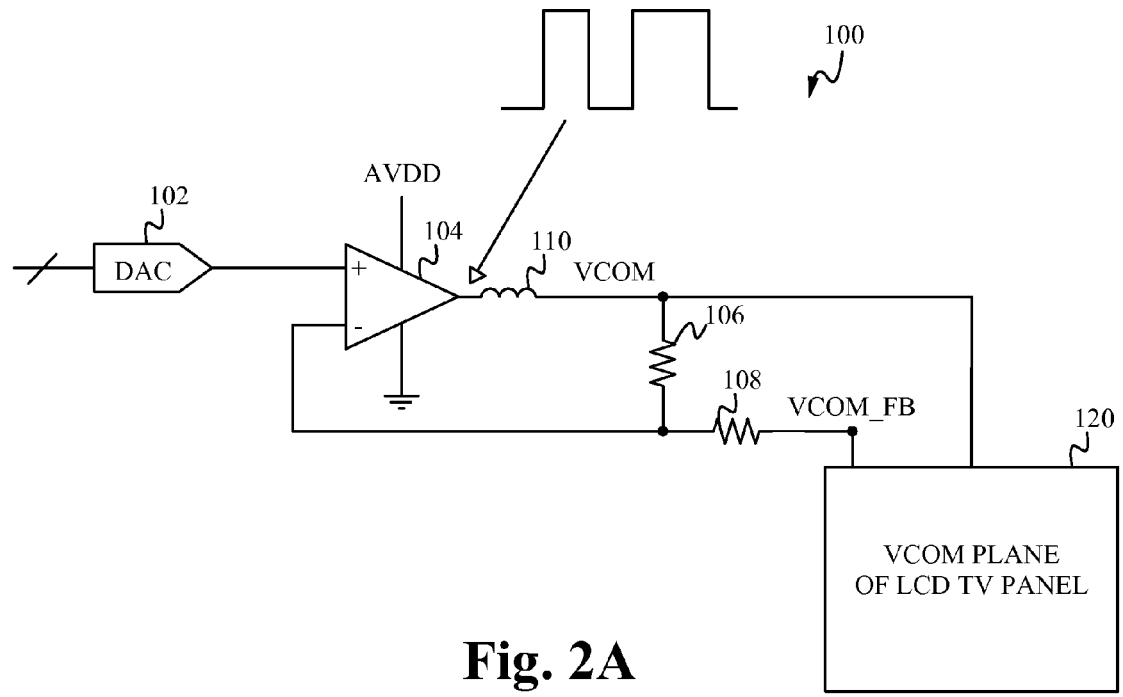
FIG. 2A illustrates a conceptual diagram of a $V_{COM}$ application circuit according to an embodiment.

FIG. 2A illustrates a conceptual diagram of a $V_{COM}$ application circuit 100 according to an embodiment of the present invention. The $V_{COM}$ application circuit 100 includes a DAC 102, a switching operational amplifier 104, an inductor 110, a resistor 106, and a resistor 108. The $V_{COM}$ application circuit 100 is coupled to a backplane of a $V_{COM}$ display panel 120. The backplane is also referred to as a $V_{COM}$ plane. The $V_{COM}$ plane 120 receives the $V_{COM}$ voltage output from switching amplifier 104. The DAC 102 receives as input a digital code representative of the proper $V_{COM}$ voltage level. The DAC 102 outputs a converted analog signal to a first input of the switching amplifier 104. A second input of the switching amplifier 104 is a feedback signal, referred to as the common voltage feedback $V_{COM\_FB}$. The switching amplifier 104 is supplied with an analog power supply voltage AVDD. In some embodiments, the analog supply voltage AVDD has a maximum voltage in the range of about 8V to about 30V. The switching amplifier 104 functions as a switching power supply and therefore outputs a switching waveform, such as that shown in FIG. 2A. The switching waveform output from the switching amplifier 104 is filtered resulting in the $V_{COM}$ voltage level that is supplied to a backplane, or $V_{COM}$ plane, of the $V_{COM}$ display panel 120. The $V_{COM}$ plane 120 distributes the $V_{COM}$ voltage to each pixel within the $V_{COM}$ display panel. In some applications, the transient current output from the switching amplifier is about 1 amp, where the transient current occurs when a horizontal line of the display is refreshed. In some applications, the load coupled to the $V_{COM}$ application circuit is a DC load that requires a DC current output from the $V_{COM}$ application circuit. In other applications, the load is not a DC load.

Figure 4:
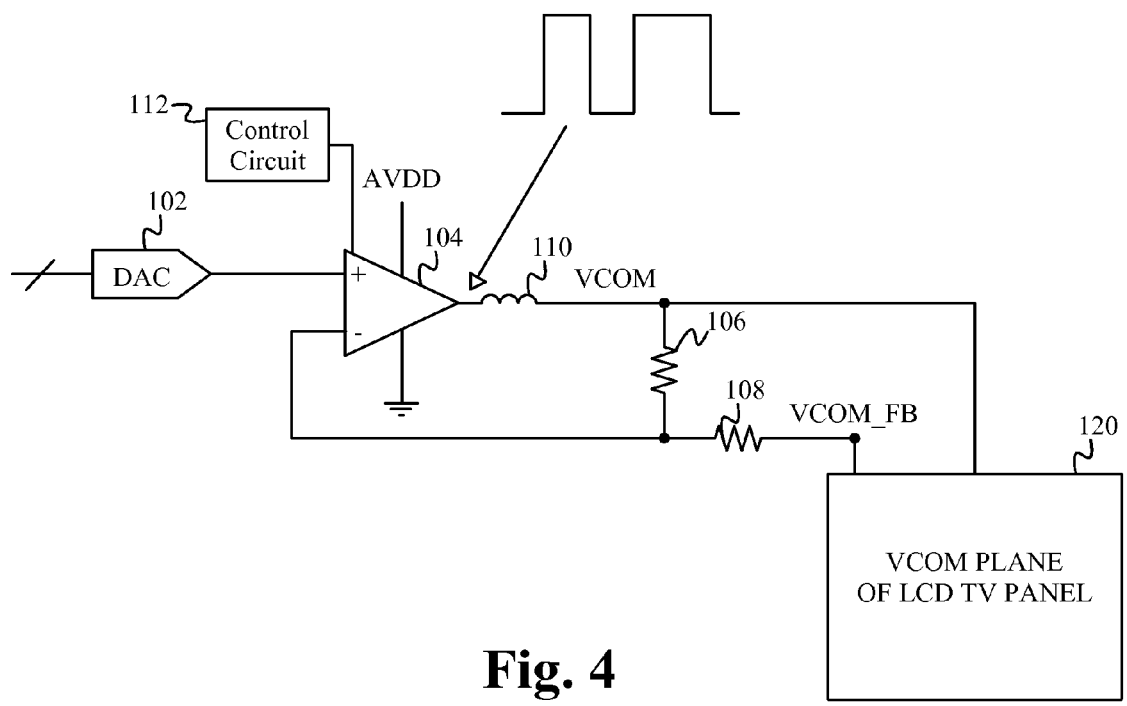
FIG. 4 illustrates the conceptual block diagram of the $V_{COM}$ application circuit of FIG. 2A including a control circuit according to an embodiment.

The switching amplifier 104 modulates the duty cycle of the square wave output to generate the desired $V_{COM}$ voltage level. In some embodiments, a control circuit 112 is coupled to the switching amplifier 104, as shown in FIG. 4. The control circuit 112 is coupled to the switching amplifier 104 so as to modulate a duty cycle of the switching waveform.

The control circuit 112 can also be configured to perform additional control functionality directed to controlling the switching amplifier and/or additional components that may be added to the $V_{COM}$ application circuit. For example, the control circuit 112 can be configured to control a modified $V_{COM}$ application circuit to stabilize with large transient output currents but without experiencing power dissipation and heat rise in the switching amplifier. In this exemplary application, a transient assist circuit having a plurality of switches controlled by the control circuit 112 can be added to the $V_{COM}$ application circuit such that the $V_{COM}$ voltage is driven quickly to the positive or negative supply during a transient situation. An example of such a $V_{COM}$ application circuit including the transient assist circuit is described in the co-pending and co-owned U.S. patent application Ser. No. 13/405,049, filed Feb. 24, 2012, titled "$V_{COM}$ Amplifier with Transient Assist Circuit," which application is hereby incorporated herein by reference in its entirety.

In another example, the control circuit 112 can be configured to control a modified $Y_{COM}$ application circuit to quickly change its closed-loop gain. In this exemplary application, the $V_{COM}$ application circuit is modified to include variable-resistance resistors, the resistance of which is controlled by the control circuit 112. An example of such a $V_{COM}$ application circuit including variable-resistance resistors is described in the co-pending and co-owned U.S. patent application Ser. No. 13/405,090, filed Feb. 24, 2012, titled "$V_{COM}$ Amplifier with Fast-Switching Gain," which application is hereby incorporated herein by reference in its entirety.

A filter comprising the inductor 110 and the capacitance of the $V_{COM}$ plane 120 filters the switching waveform so as to output the $V_{COM}$ voltage level. There is an inherent parasitic capacitance within the $V_{COM}$ plane 120. The filter is designed to consider this parasitic capacitance. If the parasitic capacitance is insufficient to meet the design considerations for the filter, additional capacitance can be added to the $V_{COM}$ application circuit, such as coupling a capacitor to the inductor 110. Using a switching amplifier requires proper selection of the inductor 110 and any additional capacitance to provide necessary circuit stability and quickness of the transient response of the $V_{COM}$ voltage output to the $V_{COM}$ plane 120 in the case of a changing output load.

Figure 2B:
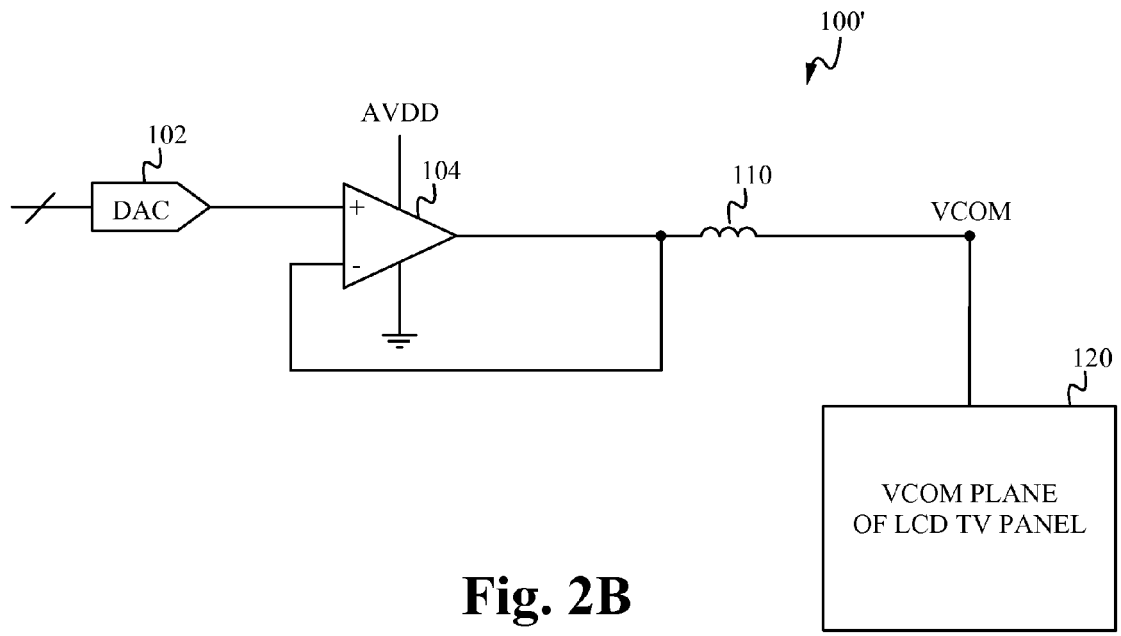
FIG. 2B illustrates a conceptual diagram of an alternative $V_{COM}$ application circuit according to another embodiment.
Figure 2C:
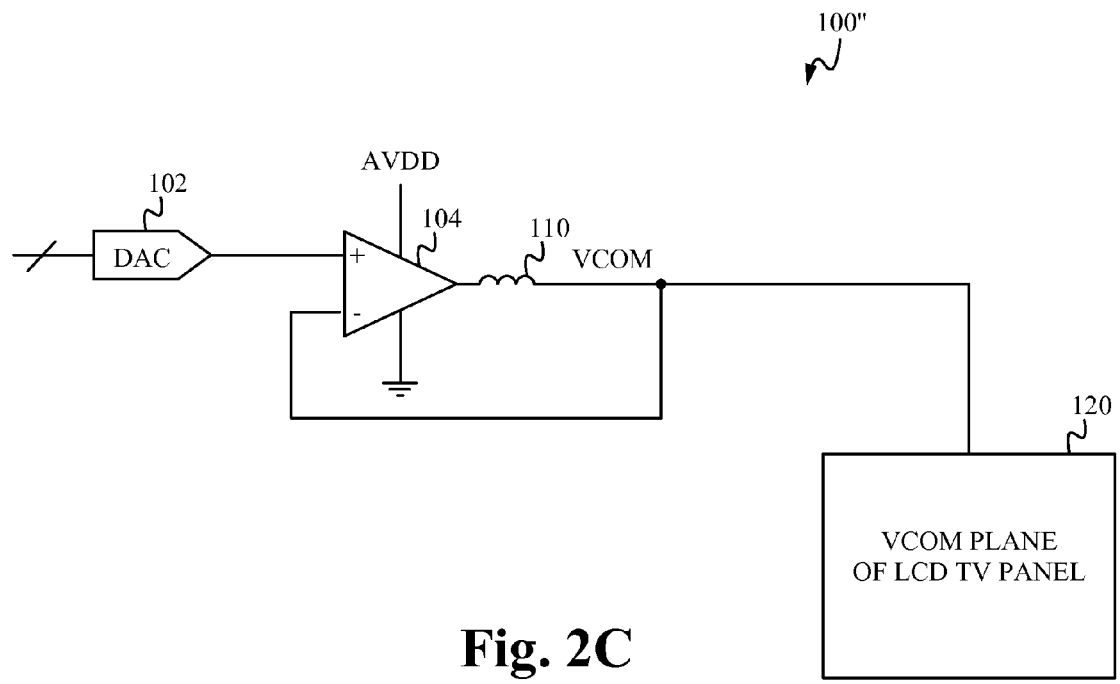
FIG. 2C illustrates a conceptual diagram of an alternative $V_{COM}$ application circuit according to yet another embodiment.
Figure 3:
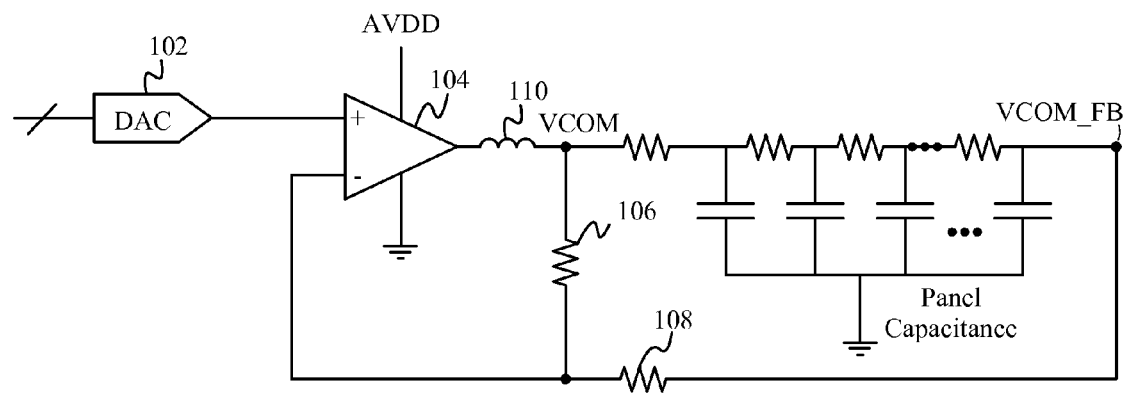
FIG. 3 illustrates the $V_{COM}$ application circuit of FIG. 2 where the $V_{COM}$ plane is replaced by its conceptual circuit equivalent.

In some embodiments, the $V_{COM}$ voltage level is substantially constant. An alternative configuration of a $V_{COM}$ application circuit 100', as shown in FIG. 2B, can also be implemented to provide a constant $V_{COM}$ voltage level. The $V_{COM}$ application circuit 100' includes a local feedback from the output of the switching amplifier 104 to the second input of the switching amplifier 104. Another alternative configuration of a $V_{COM}$ application circuit to provide a constant $V_{COM}$ voltage level 100" is shown in FIG. 2C and includes a local feedback from the other terminal of the inductor 110 to the second input of the switching amplifier 104. In other embodiments, the $V_{COM}$ voltage level can be adjusted using the $V_{COM}$ application circuit 100 (FIG. 2A) by providing a feedback signal from the $V_{COM}$ plane 120 to the second input of the switching amplifier 104. FIG. 3 illustrates the $V_{COM}$ application circuit 100 of FIG. 2A where the $V_{COM}$ plane is replaced by its conceptual circuit equivalence, which is a series of RC strings. The voltage across the circuit is the substantially constant $V_{COM}$ voltage level.

An advantage of using a switching amplifier in the $V_{COM}$ application circuit is a significant improvement in the power efficiency when compared to conventional $V_{COM}$ application circuits using Class AB amplifiers. Especially when applied to $V_{COM}$ display panels requiring relatively high analog power supply levels, such as 8V to 18V, the improvement in power efficiency also leads to a significant reduction in heat generated by the $V_{COM}$ application circuit.

The present application has been described in terms of specific embodiments incorporating details to facilitate the understanding of the principles of construction and operation of the $V_{COM}$ application circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed:

1. An electronic device for driving a display that uses a common voltage, the electronic device comprising:
   a common voltage application circuit coupled to the display to supply the display with the common voltage, wherein the common voltage application circuit comprises a switching amplifier configured to output a switching waveform used to form the common voltage; and
   a filter coupled between the switching amplifier and the display, the filter is formed by an inductor and a fixed capacitance inherent to the display, wherein the inductor is designed to cause the filter to improve a transient response of the common voltage application circuit.

2. The electronic device of claim 1 wherein the display comprises a liquid crystal display.

3. The electronic device of claim 2 wherein the liquid crystal display comprises a plurality of pixels, and the common voltage is supplied to each pixel of the plurality of pixels.

4. The electronic device of claim 1 wherein the switching amplifier is coupled to an analog power supply.

5. The electronic device of claim 4 wherein the analog supply voltage supplies a voltage in the range of about 8V to about 30V.

6. The electronic device of claim 1 wherein the switching amplifier comprises a Class D amplifier.

7. The electronic device of claim 1 wherein the filter further comprises a capacitor.

8. The electronic device of claim 1 further comprising a control circuit coupled to the switching amplifier, wherein the control circuit is configured to control the switching amplifier so as to modulate a duty cycle of the switching waveform.

9. An electronic device for driving a display that uses a common voltage, the electronic device comprising:
   a common voltage application circuit coupled to the display to supply the display with the common voltage, wherein the common voltage application circuit comprises a Class D switching amplifier configured to output a switching waveform and an inductor coupled to an output of the Class D switching amplifier, the inductor receives the switching waveform and outputs the common voltage, wherein the inductor together with a fixed capacitance inherent to the display forms a filter that filters the switching waveform to improve a transient response of the common voltage application circuit.

10. The electronic device of claim 9 wherein the display comprises a liquid crystal display.

11. The electronic device of claim 10 wherein the liquid crystal display comprises a plurality of pixels, and the common voltage is supplied to each pixel of the plurality of pixels.

12. The electronic device of claim 9 wherein the Class D switching amplifier is coupled to an analog power supply.

13. The electronic device of claim 12 wherein the analog supply voltage supplies a voltage in the range of about 8V to about 30V.

14. The electronic device of claim 9 wherein the common voltage application circuit further comprises a filter coupled between the switching amplifier and the display.

15. The electronic device of claim 14 wherein the filter comprises the inductor and a capacitance of the display.

16. The electronic device of claim 15 wherein filter further comprises a capacitor.

17. The electronic device of claim 9 further comprising a control circuit coupled to the Class D switching amplifier, wherein the control circuit is configured to control the Class D switching amplifier so as to modulate a duty cycle of the switching waveform.

18. A method of driving a display that uses a common voltage, the method comprising:
   using a common voltage application circuit comprising a switching amplifier to supply a switching waveform;
   forming a common voltage from the switching waveform;
   filtering the switching waveform using a filter that is formed by a fixed capacitance inherent to the display and an inductor to provide circuit stability and improve a transient response of the common voltage application circuit; and
   providing the common voltage to the display.

* * * * *